United States Patent
Van De Goor

(10) Patent No.: US 6,555,470 B2
(45) Date of Patent: Apr. 29, 2003

(54) METHOD OF MANUFACTURING A SEMICONDUCTOR DEVICE WITH METALLIZATION LAYERS INTERCONNECTED BY TUNGSTEN PLUGS

(75) Inventor: Albertus Theodorus Maria Van De Goor, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/101,329

(22) Filed: Mar. 19, 2002

(65) Prior Publication Data

US 2002/0155651 A1 Oct. 24, 2002

(30) Foreign Application Priority Data

Mar. 21, 2001 (EP) .............................. 01201050

(51) Int. Cl.[7] .......................................... H01L 21/4763
(52) U.S. Cl. ...................................... 438/637; 438/648
(58) Field of Search ................................ 438/635, 637, 438/647, 648, 669, 902, 618, 438, 655, 656

(56) References Cited

U.S. PATENT DOCUMENTS

| 5,536,678 A | * | 7/1996 | Peek |
| 5,801,095 A | | 9/1998 | Huang et al. ................ 438/627 |
| 5,904,556 A | | 5/1999 | Suzuki et al. ................ 438/623 |

* cited by examiner

Primary Examiner—David Nelms
Assistant Examiner—Phuc T. Dang
(74) Attorney, Agent, or Firm—Aaron Waxler

(57) ABSTRACT

Method of making a semiconductor device, in which method a first layer of silicon oxide (10) is deposited on a surface (2) of a silicon body (1), which layer is then provided with contact windows (11) within which semiconductor zones (5) formed in body and conductor tracks (6) of non-crystalline silicon formed on the surface are exposed. On the first layer of silicon oxide a first metallization layer is formed, comprising conductor tracks (16) which are in contact with the semiconductor zones (5) and conductor tracks (6) within the contact windows (11). The first metallization is then covered with a second layer of silicon oxide (17) which is provided with contact windows (19) within which the conductor tracks (16) of the first metallization are exposed. Then, successively, an adhesion layer (20) is deposited, the contact windows (19) are filled with tungsten plugs (22), and a second metallization layer is formed comprising conductor tracks in contact with the tungsten plugs. The conductor tracks (16) of the first metallization layer are formed in a tungsten layer, and a layer consisting only of titanium nitride deposited as the adhesion layer (20). Due to said choice of material, the connections between the conductor tracks of the first and the second metallization layer only show small mutual differences in contact resistance.

6 Claims, 3 Drawing Sheets

Figure 1:
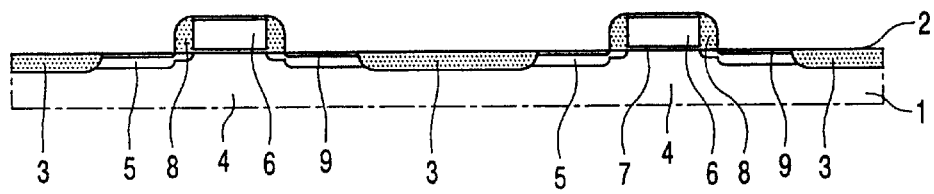

METHOD OF MANUFACTURING A SEMICONDUCTOR DEVICE WITH METALLIZATION LAYERS INTERCONNECTED BY TUNGSTEN PLUGS

The invention relates to a method of manufacturing a semiconductor device whereby a first layer of silicon oxide is deposited on a surface of a silicon body and is provided with contact windows within which semiconductor zones formed in the semiconductor body and conductor tracks of non-crystalline silicon formed on the surface are exposed, while on said first layer of silicon oxide a first metallization layer is formed which makes contact in the contact windows with the active semiconductor zones and with the conductor tracks of non-crystalline silicon and which is covered with a second layer of silicon oxide which is provided with contact windows within which the first metallization layer is exposed, whereupon consecutively an adhesion layer is deposited on the second layer of silicon oxide and in the contact windows formed therein, the contact windows are filled with tungsten plugs, and a second metallization layer is formed on the layer of insulating material so as to make contact with the tungsten plugs formed in the contact windows.

The conductor tracks of non-crystalline silicon may be formed in a layer of polycrystalline silicon, but also in a layer of amorphous silicon. The tungsten plugs may be formed in the contact windows in the second layer of silicon oxide in that a thick layer of tungsten is deposited, which is subsequently subjected to an etching treatment until the adhesion layer next to the contact windows has become exposed again. Instead of the etching treatment, a chemical-mechanical polishing treatment may be used.

Such a method is known from U.S. Pat. No. 5,529,955, wherein the first metallization is formed by an Al layer or a layer of an alloy of Al with Si and Cu, while the adhesion layer used is a layer comprising one or several materials from the group of Ti, TiN, TiW, and WSi. Preferably, a laminate of layers from said group of materials is used as the adhesion layer, such as a layer of Ti on which a layer of TiN is deposited.

It is a disadvantage of the use of Al or said alloy of Al as a first metallization layer that the contact between the semiconductor zones and the metallization can change during operation of the semiconductor device owing to electromigration.

The invention has for its object inter alia to counteract the above disadvantage. The method mentioned in the opening paragraph is for this purpose characterized in that the first metallization layer is formed in a tungsten layer, while a layer of titanium nitride is deposited as the adhesion layer on the second layer of silicon oxide and in the contact windows formed therein.

The first metallization layer is formed in a layer of tungsten. No change occurs in the contact resistance between the semiconductor zones and the conductor tracks connected thereto during operation of the semiconductor device if a layer of tungsten is used. In addition, the layer of silicon oxide to be formed on the first metallization layer can be deposited at a comparatively high temperature on a layer of such a refractory metal without causing damage to the metallization. A thin and dense layer of silicon oxide may thus be formed. A problem arises, however, if the preferably used adhesion layer consisting of a laminate of a layer of Ti on which a layer of TiN is deposited is used in the formation of tungsten plugs on a first metallization layer of tungsten in the known method as described above. It is found that a contact resistance measured between the first metallization of tungsten and the tungsten plugs formed in the contact windows in the layer of silicon oxide deposited thereon on the first metallization layer has a considerable spread over the plugs. This spread may be so great that the method is unsuitable for use in the manufacture of semiconductor devices. It was surprisingly found that the use of an adhesion layer exclusively consisting of TiN leads to said spread being much smaller, which results in the method being suitable for use in the manufacture of semiconductor devices.

Preferably, the first metallization layer is formed in a tungsten layer which is deposited on an adhesion layer which is formed on the first layer of silicon oxide and in the contact windows formed therein and which consists of a layer of titanium and a layer of titanium nitride deposited thereon. If the adhesion layer consisting of a laminate of a layer of Ti on which a layer of TiN is deposited is used, the contact resistance between the semiconductor zones and the first metallization layer, as seen over the contact windows in the first layer of silicon oxide, will have only a small spread. The use of an adhesion layer purely made of TiN is found to make the spread in the contact resistance greater here.

A low contact resistance between the semiconductor zones and the first metallization is obtained if the active semiconductor zones and the conductor tracks of non-crystalline silicon which are formed on the surface and with which the first metallization makes contact are provided with a top layer of titanium disilicide before the deposition of the first layer of silicon oxide.

The invention will be explained in more detail below by way of example with reference to a drawing, in which:

FIGS. 1 to 10 diagrammatically and in cross-section show a number of stages in the manufacture of a semiconductor device utilizing the method according to the invention.

FIGS. 1 to 10 diagrammatically and in cross-section show a number of stages in the manufacture of a semiconductor device. In this example, as shown in FIG. 1, first a silicon body 1 is provided with field oxide regions 3 adjoining a surface 2 of said body through local oxidation of silicon. MOS transistors with source and drain zones 5 and with gate electrodes 6 formed in a layer of polycrystalline silicon are created in a usual manner in the active regions 4 surrounded by said field oxide regions 3. The gate electrodes 6 lie on a layer of gate oxide 7 and are provided with silicon oxide spacers 8 at their lateral sides. In this example, the source and drain zones 5 and the gate electrodes 6 are provided with a well-conducting top layer 9.

Figure 2:
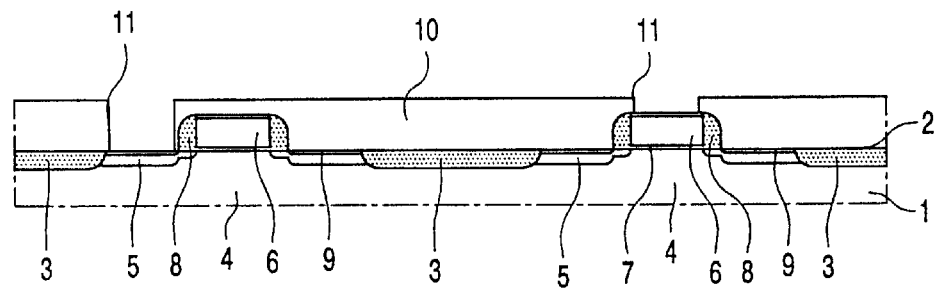

As is shown in FIG. 2, a first layer of silicon oxide 10 is deposited on the structure thus formed and is subsequently provided with contact windows 11 within which semiconductor zones, the source and drain zones 5 in this case, formed in the semiconductor body and conductor tracks of non-crystalline silicon, the gate electrodes 6 in this case, formed on the surface are exposed. Not all source and drain zones and not all gate electrodes are contacted in the example. It will be obvious that contact windows may also be situated outside the plane of drawing.

Figure 3:
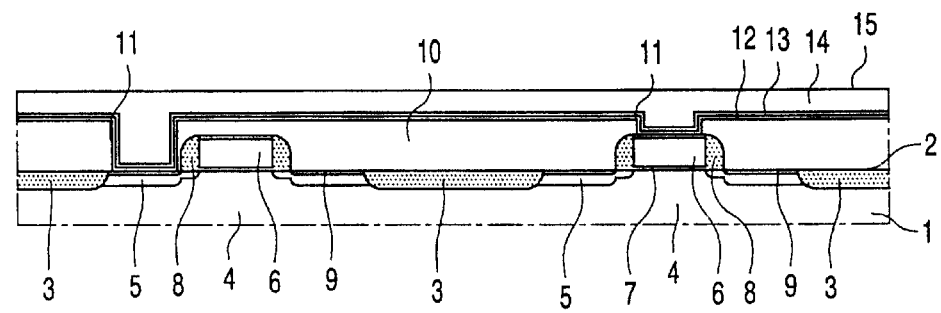
Figure 4:
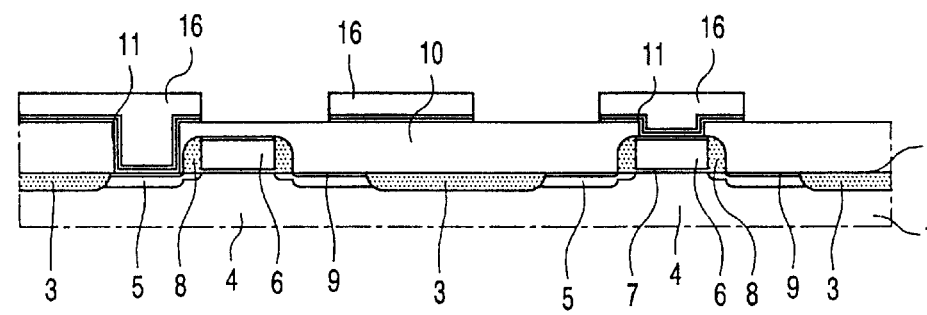

As is shown in FIGS. 3 and 4, conductor tracks 16 are formed on the first layer of silicon oxide 10, which tracks form a first metallization layer and make contact with the source and drain zones 5 and with the gate electrodes 6 in the contact windows 11. For this purpose, an approximately 40 nm thick layer of Ti 12, an approximately 60 nm thick layer of TiN 13, and an approximately 500 nm thick layer of tungsten 14 are deposited in that order on the first layer of silicon oxide 10 and in the contact windows in this example, as is shown in FIG. 3. The tungsten layer 14 has a comparatively smooth surface 15.

Conductor tracks 16 forming said first metallization layer are then provided in a usual manner in the layers 12, 13, and 14 deposited on the first layer of silicon oxide 10 and in the contact windows 11, as is shown in FIG. 4. The formation of the first metallization in a layer of tungsten avoids a change in the contact resistance between the metallization and the semiconductor zones 5 and the conductor tracks of non-crystalline silicon 6 during operation of the semiconductor device owing to electromigration.

Figure 5:
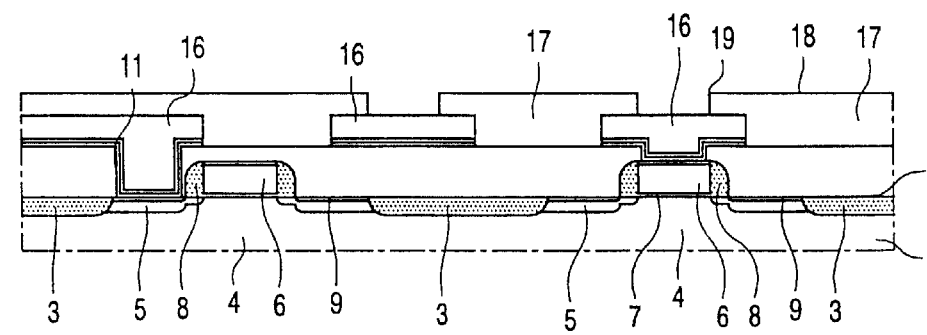

The structure thus formed is subsequently covered with a second layer of silicon oxide 17, as shown in FIG. 5. An approximately 500 nm thick layer is deposited in a usual plasma CVD process, during which the semiconductor body is heated to a temperature of approximately 400° C. This layer is subjected to a chemical-mechanical polishing treatment whereby the layer above the conductor tracks 16 of the first metallization is given a thickness of approximately 200 nm and is in addition provided with a smooth surface 18. This second layer of silicon oxide 17 is provided with contact windows 19 within which the conductor tracks 16 of the first metallization layer are exposed.

Figure 6:
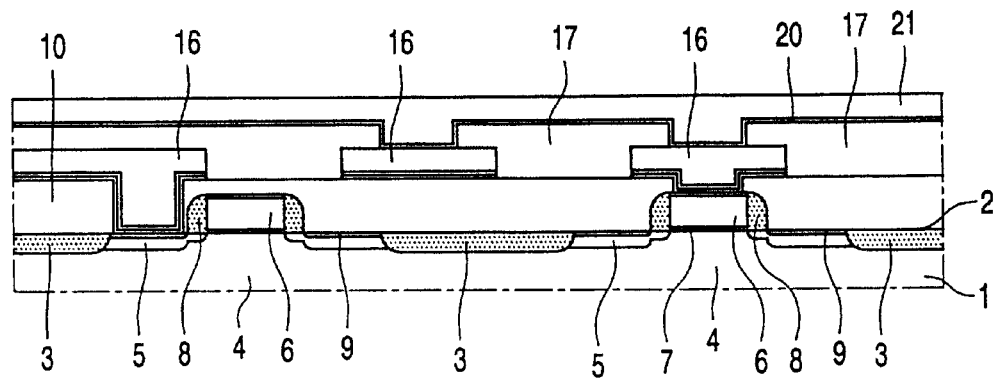
Figure 7:
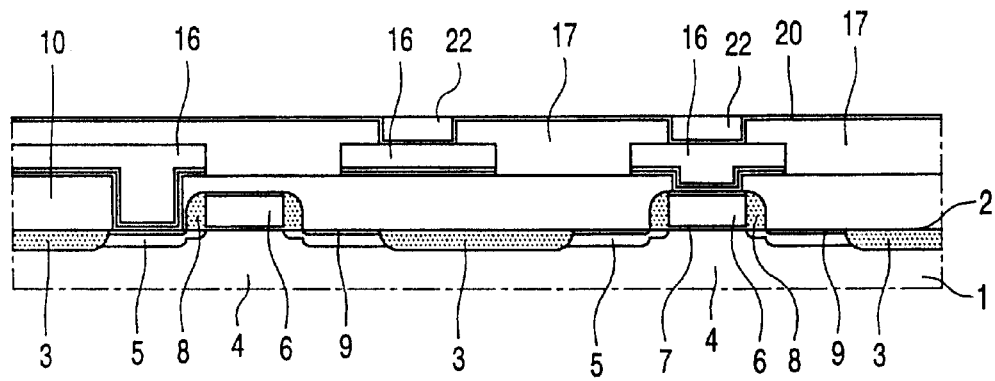

Subsequently, see FIG. 6, an adhesion layer 20 and an approximately 500 nm thick layer of tungsten are deposited in that order on the second layer of silicon oxide 17 and in the contact windows 19. The tungsten layer 21 is subsequently subjected to a chemical-mechanical polishing treatment until the adhesion layer 20 on the layer of silicon oxide 17 has become exposed. The contact windows 19 have thus been filled with plugs 22 of tungsten.

Figure 8:
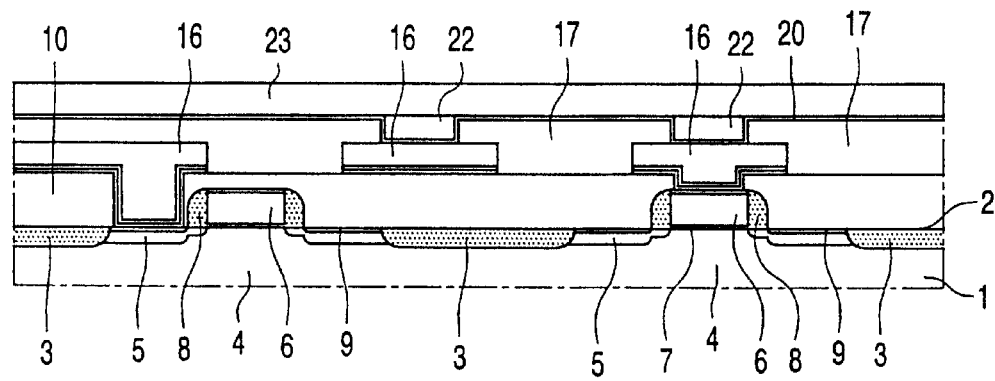
Figure 9:
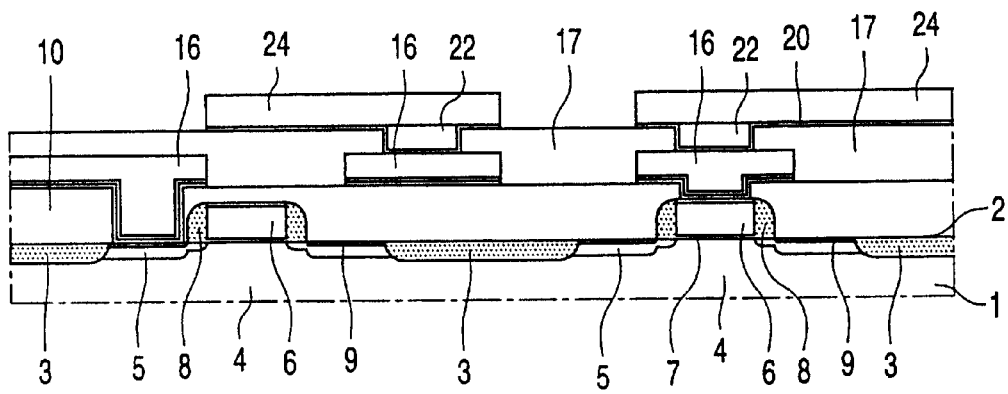
Figure 10:
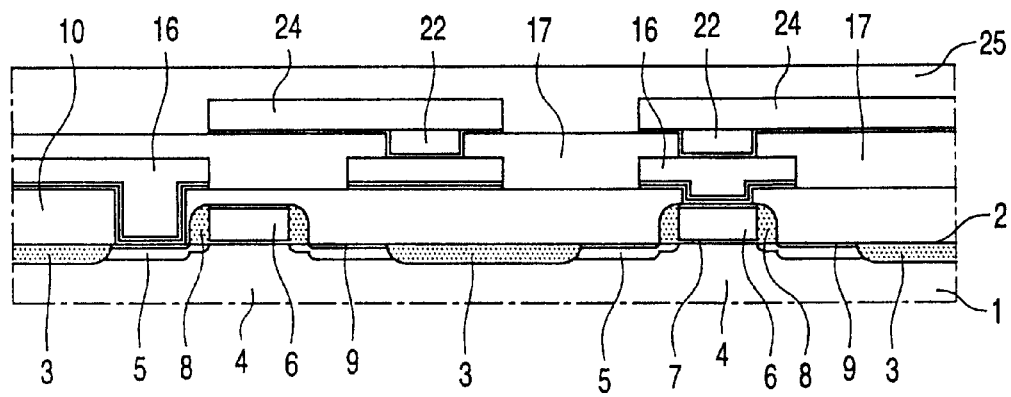

As is shown in FIG. 8, a layer 23 of a usual alloy of aluminum with silicon and copper is deposited. Then, see FIG. 9, conductor tracks 24 are formed in the layer 23 and the subjacent adhesion layer 20, which tracks form a second metallization layer and make contact with the tungsten plugs 22 formed in the contact windows 19. Finally, the structure thus formed is sealed off with an insulating and passivating layer 25.

During the formation of the conductor tracks 16 of the first metallization layer, an adhesion layer is used consisting of a laminate of an approximately 40 nm thick layer Ti 12 on which an approximately 60 nm thick layer TiN 13 is deposited. The adhesion layer 20 used for the formation of the tungsten plugs 22 is an approximately 100 nm thick layer of TiN. If an adhesion layer comprising a laminate of a layer of Ti on which a layer of TiN is deposited were used here as well, a problem would arise. It is found in that case that a contact resistance is measured between the conductor tracks 16 of the first metallization layer and the tungsten plugs 22 which shows a wide spread as seen over the plugs. Said spread is much smaller with the use of an adhesion layer comprising exclusively TiN. Contact resistances are measured which lie between 0.8 and 2.4 ohms in contact windows 11 with a diameter of 500 nm if the Ti—TiN adhesion layer is used. With an adhesion layer consisting purely of TiN in the same contact windows, contact resistances are measured which lie between 0.8 and 1.2 ohms.

The conductor tracks 16 of the first metallization layer are formed in a tungsten layer 14 which is deposited on an adhesion layer which is formed on the first layer of silicon oxide 10 and in the contact windows 11 formed therein and which consists of a layer of Ti 12 and a layer of TiN 13 deposited thereon. The contact resistance between the semiconductor zones and the first metallization layer, seen over the contact windows in the first layer of silicon oxide, again shows only a small spread with the use of the adhesion layer consisting of a laminate of a layer of Ti on which a layer of TiN is deposited. The use of an adhesion layer purely made of TiN by contrast is found to make the spread in the contact resistance greater here.

A comparatively small contact resistance between the semiconductor zones 5 and the conductor tracks of non-crystalline silicon 6 formed on the surface is obtained if the active semiconductor zones 5 and said conductor tracks 6 are provided in a usual manner with a top layer of titanium disilicide 9 before the deposition of the first layer of silicon oxide 10.

What is claimed is:

1. A method of manufacturing a semiconductor device where a first layer of silicon oxide is deposite on a surface of a silicon body and is provided with contact windows within which semiconductor zones formed in the semiconductor body and conductor tracks of non-crystalline silicon formed on the surface are exposed, while on said first layer of silicon oxide a first metallization layer is formed which makes contact in the contact windows with the active semiconductor zones and with the conductor tracks of non-crystalline silicon and which is covered with a second layer of silicon oxide which is provided with contact windows within which the first metallization layer is exposed, whereupon consecutively an adhesion layer is deposited on the second layer of silicon oxide and in the contact windows formed therein, the contact windows are filled with tungsten plugs, and a second metallization layer is formed on the layer of insulating material so as to make contact with the tungsten plugs formed in the contact windows, wherein the first metallization layer is formed in a tungsten layer, while a layer of titanium nitride is deposited as the adhesion layer on the second layer of silicon oxide and in the contact windows formed therein.

2. A method as claimed in claim 1, wherein the first metallization layer is formed in a tungsten layer which is deposited on an adhesion layer which is formed on the first layer of silicon oxide and in the contact windows formed therein and which consists of a layer of titanium and a layer of titanium nitride deposited thereon.

3. A method as claimed in claim 2, wherein the active semiconductor zones and the conductor tracks of non-crystalline silicon with which the first metallization makes contact are provided with a top layer of titanium disilicide before the deposition of the first layer of silicon oxide.

4. A method of manufacturing a semiconductor device comprising the steps of:

depositing a first layer of silicon oxide on a surface of a silicon body;

providing contact windows so that active semiconductor zones formed in a semiconductor body and conductor tracks of non-crystalline silicon formed on the surface are exposed, forming on the first layer of silicon oxide a first metallization layer which makes contact in the contact windows with the active semiconductor zones and with the conductor tracks of non-crystalline silicon;

covering the first layer of silicon oxide with a second layer of silicon oxide which is provided with contact windows within which the first metallization layer is exposed;

depositing an adhesion layer on the second layer of silicon oxide and in the contact windows formed therein, the contact windows being are filled with tungsten plugs; and forming a second metallization layer on the second layer of silicon oxide so as to make contact with the tungsten plugs formed in the contact windows, wherein the first metallization layer is formed in a tungsten layer and the adhesion layer on the second layer of silicon oxide is formed by a layer of titanium nitride.

5. A method according to claim 4, wherein the first metallization layer is formed in a tungsten layer which is deposited on a first adhesion layer which is formed on the first layer of silicon oxide and in the contact windows formed therein and which consists of a layer of titanium and a layer of titanium nitride deposited thereon.

6. A method according to claim 4, wherein the active semiconductor zones and the conductor tracks of non-crystalline silicon with which the first metallization makes contact are provided with a top layer of titanium disilicide before the deposition of the first layer of silicon oxide.

* * * * *